(12) United States Patent
Lee

(10) Patent No.: US 6,252,444 B1
(45) Date of Patent: Jun. 26, 2001

(54) RESET SIGNAL GENERATION CIRCUIT

(75) Inventor: Kang-Bok Lee, Chungcheongbuk-do (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/391,373

(22) Filed: Sep. 8, 1999

(30) Foreign Application Priority Data

Oct. 16, 1998 (KR) .................................................. 98-43325

(51) Int. Cl.[7] ........................................................ H04L 7/00
(52) U.S. Cl. ............................................ 327/156; 327/159
(58) Field of Search ..................................... 327/147, 148, 327/149, 150, 151, 156, 157, 158, 159, 160; 331/11, 25

(56) References Cited

U.S. PATENT DOCUMENTS 5,671,260 * 9/1997 Yamauchi et al. ..................... 375/372
5,786,717   7/1998 Yu ......................................... 327/143

\* cited by examiner

Primary Examiner—Tuan T. Lam
(74) Attorney, Agent, or Firm—Fleshner & Kim, LLP

(57) ABSTRACT

A reset signal generation circuit of the present invention includes a phase locked loop (PLL) selector, a plurality of PLLs, a locking detector, a clock selector, a counter, and a reset synchronizer. The PLL selector is activated when an external reset signal is high and provides a signal for selecting one of the plurality of PLLs according to a power down control signal and a PLL selection signal. The plurality of PLLs have different input frequency signals and different output frequency signals. They are activated in response to an external clock signal and inactivated in response to the power down control signal. The locking detector detects locking/unlocking of the PLLs based upon the output frequency signals of the PLLs and generates a locking signal. The clock selector selectively provides one of the output signals of the PLLs and the external clock signal. The counter is coupled to the clock selector and generates an overflow signal after completing count of a predetermined number. In response to the overflow signal of the counter, the reset synchronizer generates an internal reset signal synchronizing with the locking signal. The present invention controls the stable reset mode release time regardless of the settling time of the oscillation signal by controlling the reset signal using the locking signal of the PLL. A current state is maintained even though the locking state of the PLL is released, so the operation of the chip is not influenced by the reset of the PLL.

14 Claims, 4 Drawing Sheets

RESET SIGNAL GENERATION CIRCUIT

BACKGROUND OF THE INVENTION

1. Field of the Invention

The present invention relates to a clock signal generation circuit in a semiconductor chip and more particularly to a reset signal generation circuit for generating internal clock signals in a chip.

2. Description of Related Art

It takes a little time for a stable clock signal to be generated after a chip is powered and an oscillation circuit is activated. This period of time is called an oscillation-stability time. During the oscillation-stability time, reset signals are generated not to let the chip operate. Because not only power supply voltage is not sufficiently ensured, but also frequency of a clock signal is not stabilized during the oscillation-stability time, stability of circuit operation cannot be guaranteed, so the chip is prevented from operating using the reset signal.

FIG. 1 is a block diagram of a related art reset signal generation circuit.

Oscillator 102 performs oscillating operation in response to an incoming external clock signal, CLK_EXT.

Clock generator 104 receives an oscillation signal from the oscillator 102 and an external reset signal, /RST_EXT, and generates an internal clock signal, CLK_INT, of a predetermined frequency. The external reset signal, /RST_EXT, has an initial value of a low level and is provided as an internal reset signal, /RST_INT, to prevent the remaining elements other than the clock generator 104 from being activated.

FIG. 2 is a timing chart for showing an operating characteristic of the above related art reset signal generation circuit.

Once the chip is powered and a level of power voltage, VCC, starts to increase, oscillation of the internal clock signal, CLK_INT, starts. The frequency of the internal clock signal, CLK_INT, is not stable because the level of the power voltage, VCC, is not sufficient. At this time, the internal reset signal, /RST_INT, has a low level, so other elements in the chip do not operate.

Once the power voltage level is sufficiently ensured during the oscillation-stability time and the oscillation-stability time has been passed, the internal reset signal, /RST_INT, goes to a high level. Since the frequency of the internal clock signal, CLK_INT, is satisfactorily stable at this time, the chip becomes to operate in normal.

However, the related art reset signal generation circuit should detect a settling time of the oscillator in advance and ensure a corresponding oscillation-stability time. Such fixed oscillation-stability time may delay the start of operation of the chip unnecessarily or may not ensure an enough oscillation-stability time because the circuit cannot reflect the condition when the operating characteristic of the oscillator deteriorates.

Moreover, since the operating characteristic of the oscillator generating the oscillation signal using the external clock signal, CLK_EXT, depends upon the external clock signal, CLK_EXT, a characteristic of the oscillation signal generated by the oscillator 102 is also unstable if the external clock signal, CLK_EXT, becomes unstable.

SUMMARY OF THE INVENTION

Accordingly, the present invention is directed to a reset signal generation circuit that substantially obviates one or more of the limitations and disadvantages of the related art.

An objective of the present invention is to provide a reset signal generation circuit for generating a reset signal according to a state of an external clock signal and states of output signals of phase locked loops (PLLs) to optimize a generation time point of the reset signal.

Additional features and advantages of the invention will be set forth in the following description, and in part will be apparent from the description, or may be learned by practice of the invention. The objectives and other advantages of the invention will be realized and attained by the structure as illustrated in the written description and claims hereof, as well as the appended drawings.

To achieve these and other advantages, and in accordance with the purpose of the present invention as embodied and broadly described, a reset signal generation circuit of the present invention comprises a phase locked loop (PLL) selector, a plurality of PLLs, a locking detector, a clock selector, a counter, and a reset synchronizer.

The PLL selector is activated when an external reset signal is high and selectively provides one of a power down control signal and an external clock signal.

The plurality of PLLs have different input frequency signals and different output frequency signals. They are activated in response to an external clock signal and inactivated in response to the power down control signal.

The locking detector detects locking/unlocking of the PLLs based upon the output frequency signals of the PLLs and generates a locking signal.

The clock selector selects one of the output signals of the PLLs and the external clock signal and provides the selected signal as an internal clock signal.

The counter counts the predetermined number of internal clock signals and generates an overflow signal after completing the count.

In response to the overflow signal of the counter, the reset synchronizer generates an internal reset signal synchronizing with the locking signal.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENT

Reference will now be made in detail to the preferred embodiments of the present invention, examples of which are illustrated in the accompanying drawings.

Figure 1:
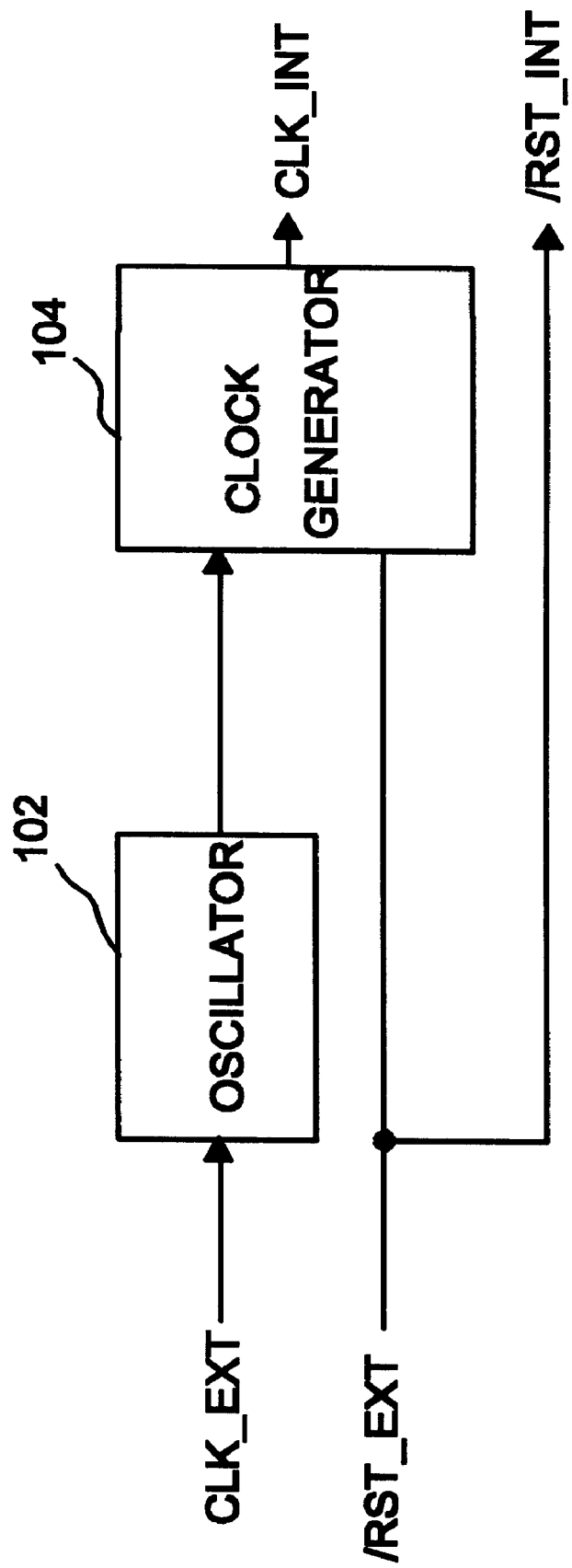
FIG. 1 is a block diagram of a related art reset signal generation circuit.
Figure 2:
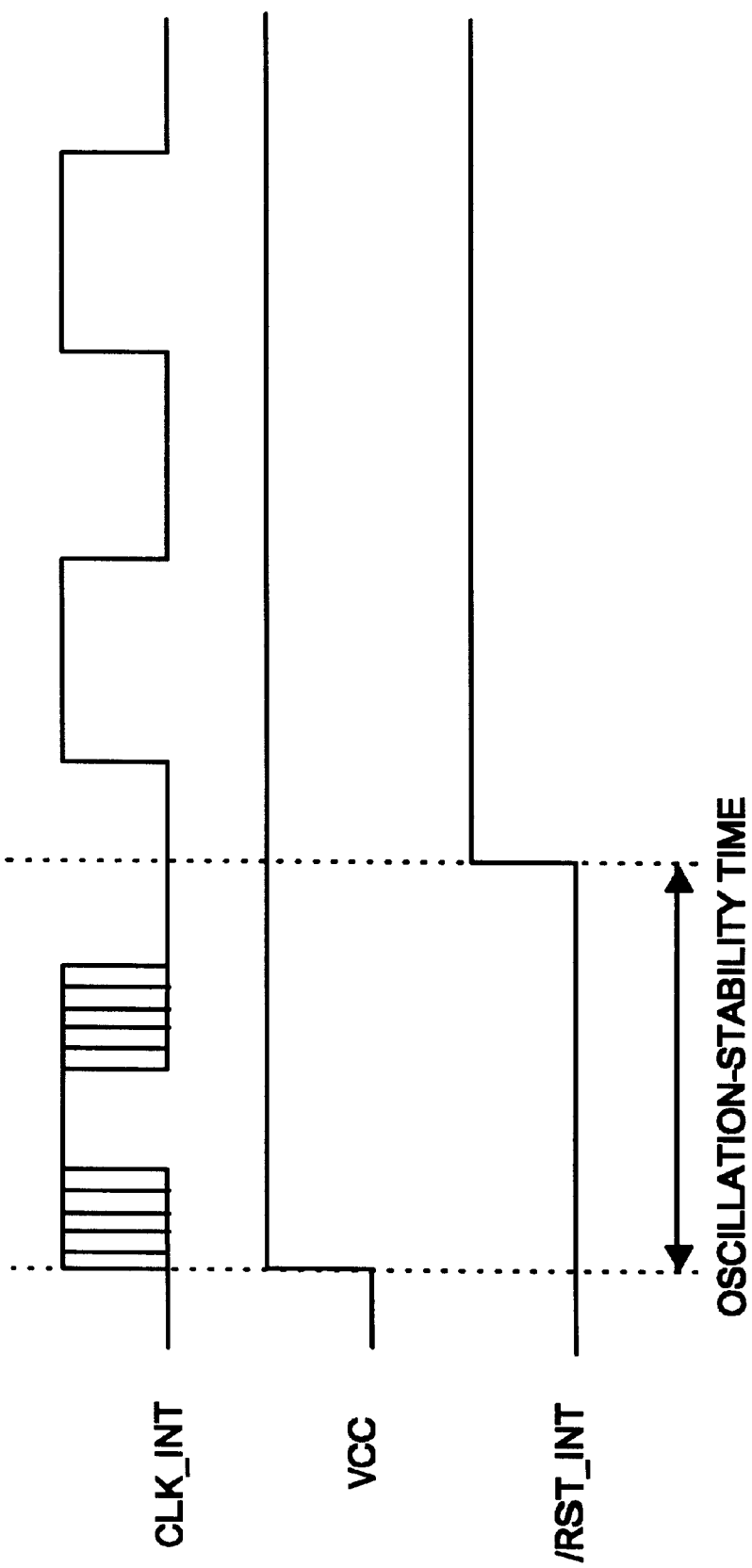
FIG. 2 is a timing chart for showing an operating characteristic of the circuit depicted in FIG. 1.
Figure 3:
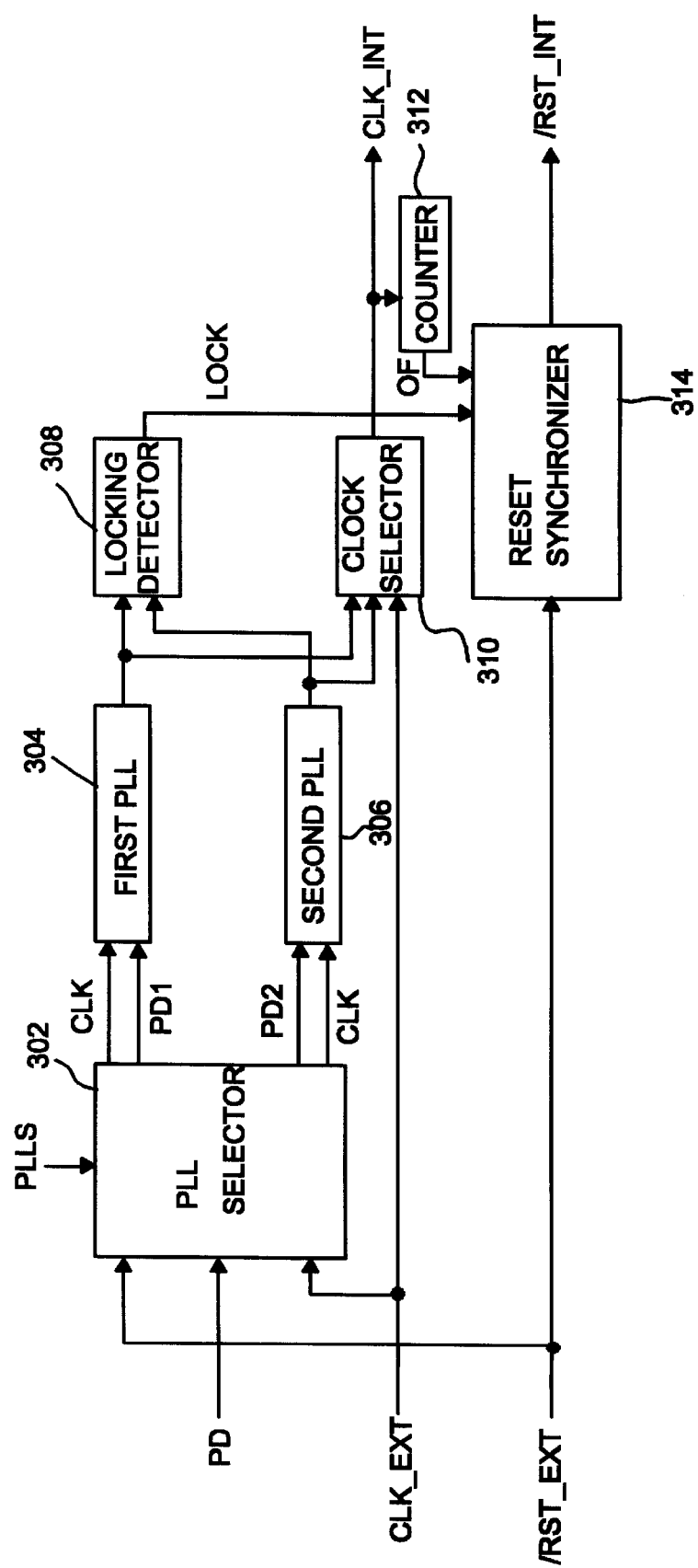
FIG. 3 is a block diagram of a reset signal generation circuit according to the present invention.
Figure 4:
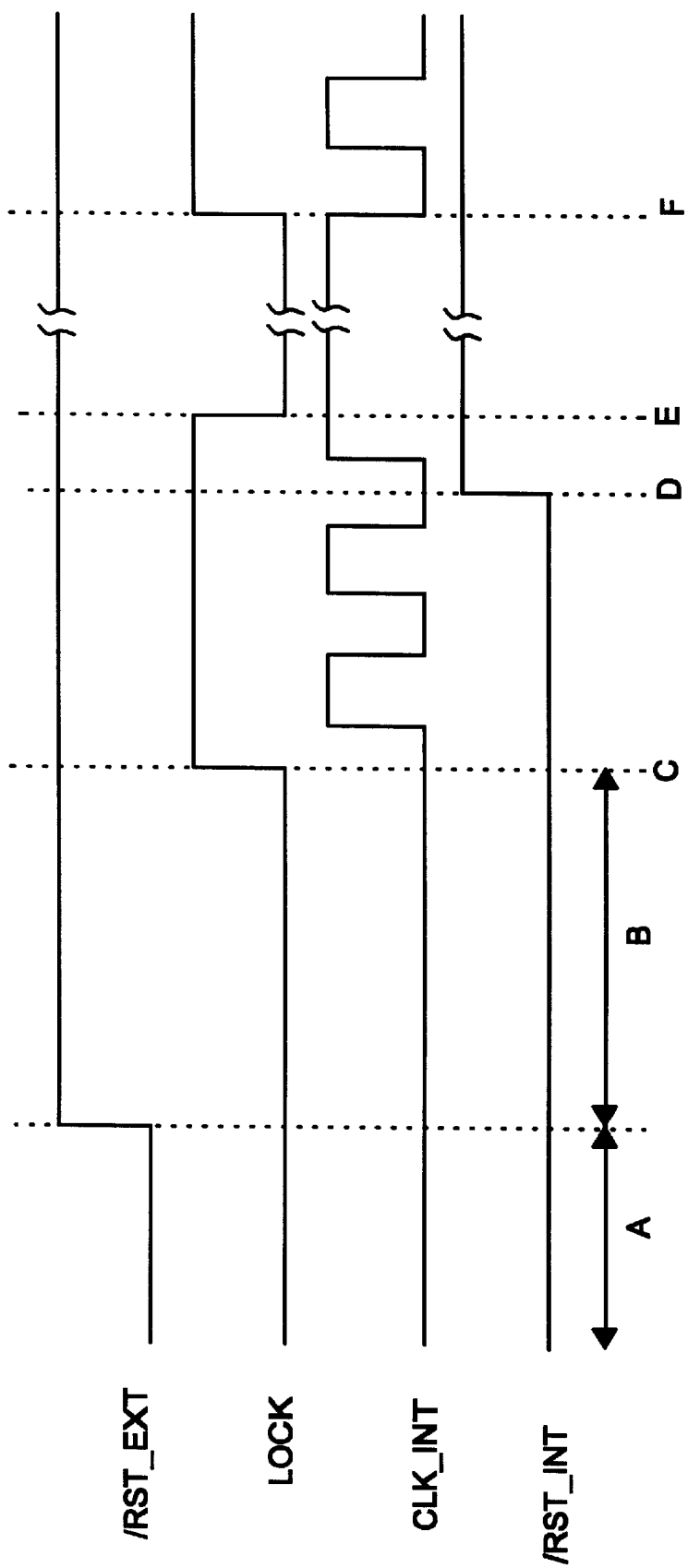
FIG. 4 is a timing chart for showing an operating characteristic of the circuit depicted in FIG. 3.

With reference to FIG. 3 and FIG. 4, the preferred embodiment of the present invention will be described.

As shown in FIG. 3, PLL selector 302 receives a power down control signal, PD, an external clock signal, CLK_EXT, an external reset signal, /RST_EXT, and a PLL selection signal, PLLS. The external reset signal, /RST_EXT, has an initial value of a low level. When the external reset signal, /RST_EXT, goes to a high level, the PLL selector is activated.

The PLL selector 302 also has a function of selecting one of two PLLs 304 and 306 that will be described below. The two PLLs 304 and 306 have different input frequency signals and different output frequency signals. Namely, one of the two PLLs is selected in accordance to a target frequency.

Each of the PLLs 304 and 306 is activated or inactivated according to the PLL selection signal, PLLS. In other words, the PLL not to be used is inactivated by a signal output from the PLL selector.

Output frequency signals of the PLLs 304 and 306 are input into both locking detector 308 and clock selector 310.

The locking detector 308 detects whether or not the PLLs 304 and 306 are locked based upon the output frequency signals of the PLLs 304 and 306. If locking of at least one of the two PLLs is detected, the locking detector 308 generates a locking signal, LOCK. The locking means that the input frequency signal of the PLL has the same phase (or frequency) as a prescribed reference frequency signal has.

The clock selector 310 receives the output frequency signals of the PLLs 304 and 306 and the external clock signal, CLK_EXT. The clock selector 310 selects and outputs one of the output frequency signals of the PLLs 304 and 306 and the external clock signal, CLK_EXT. The output signal of the clock selector 310 is provided as an internal clock signal, CLK_INT.

The clock selector 310 selects one of the output frequency signals of the PLLs 304 and 306 and the external clock signal, CLK_EXT, based upon the following reference. Each of the output frequencies of the PLLs 304 and 306 is constant. Therefore, a frequency appropriate to a present system is detected and one of the output frequency signals of the PLLs 304 and 306 and external clock signal, CLK_EXT, is used.

The internal clock signal output from the clock selector 310 is also input into counter 312. Once the internal clock signal, CLK_INT, starts to be generated, the counter 312 counts the predetermined number of internal clock signals, CLK_INT, and generates an overflow signal, OF, when the count is completed.

Reset synchronizer 314 receives the locking signal, LOCK, from the locking detector 308, the overflow signal, OF, from the counter 312, and the external reset signal, /RST_EXT. The reset synchronizer 314 is activated when the locking signal, LOCK, is generated while the external reset signal, /RST_EXT, is in an inactivated state. If the overflow signal, OF, is provided while the reset synchronizer 314 is in the activated state, the reset synchronizer 314 generates an internal reset signal, /RST_INT, in synchronization with the locking signal, LOCK. The reset synchronizer 314 is designed to operate according to an edge trigger method, so the reset synchronizer 314 maintains a current logic value once the internal reset signal, /RST_INT, is generated.

The operating characteristic of the reset signal generation circuit according to the present invention is illustrated in FIG. 4.

As shown in section A of FIG. 4, while the external reset signal, /RST_EXT, is maintained at a low level, the PLL selector 302 does not operate, so the two PLLs 304 and 306 do not operate, either.

As shown in section B of FIG. 4, if the external reset signal, /RST_EXT, is inactivated at a high level, the PLL selector 302 selects and activates one of the two PLLs 304 and 306.

If the activated PLL is locked, as shown at point C of FIG. 4, the locking signal, LOCK, is activated at the high level. At this time, the clock selector 310 selects and outputs the output frequency signal of the PLL as the internal clock signal, CLK_INT, instead of selecting the external clock signal, CLK_EXT.

After the point C when the internal clock signal, CLK_INT, is generated by the clock selector 310, the internal reset signal, /RST_INT, is kept in the activated state at the low level without change. At point D when the overflow signal, OF, of the counter 312 is output, the internal reset signal, /RST_INT, is finally inactivated at the high level and a reset state of the chip is released.

Although the locking signal, LOCK, is inactivated at the low level under this condition, both internal clock signal, CLK_INT, and internal reset signal, /RST_INT, are fixed to the high level because the reset synchronizer 314 is designed according to the edge trigger method.

Therefore, the present invention controls the stable reset mode release time regardless of the settling time of the oscillation signal by controlling the reset signal using the locking signal of the PLL. A current state is maintained even though the locking state of the PLL is released, so the operation of the chip is not influenced by the reset of the PLL.

It will be apparent to those skilled in the art that various modifications and variations can be made in the reset signal generation circuit of the present invention without deviating from the spirit or scope of the invention. Thus, it is intended that the present invention covers the modifications and variations of this invention provided they come within the scope of the appended claims and their equivalents.

What is claimed is:

1. A reset signal generation circuit comprising:
    a phase locked loop (PLL) selector that selects at least one PLL in response to a PLL selection signal;
    a plurality of PLLs of which at least one is selected in response to an output signal of said PLL selector, that generates output frequency signals;
    a locking detector that detects locking/unlocking of said PLLs;
    a clock selector that selects at least one of said output frequency signals as a first clock signal;
    a counter that generates an overflow signal after counting a predetermined number based on said first clock signal; and
    a reset synchronizer activated in response to a locking signal of said locking detector, that generates a reset signal in response to said overflow signal of said counter.

2. The reset signal generation circuit according to claim 1, wherein said PLL selector is activated when an external reset signal is high, receives a power down control signal and said PLL selection signal, and provides said output signal for selecting one of said plurality of PLLs.

3. The reset signal generation circuit according to claim 1, wherein said plurality of PLLs have different input frequency signals, said PLLs being activated in response to an external clock signal and inactivated in response to a power down control signal.

4. The reset signal generation circuit according to claim 1, wherein said locking detector detects locking states of said PLLs based upon output signals of said PLLs and provides said locking signal.

5. The reset signal generation circuit according to claim 1, wherein said clock selector receives output frequency signals of said PLLs and an external clock signal and selectively provides one of the received signals.

6. The reset signal generation circuit according to claim 1, wherein said reset synchronizer operates according to an edge trigger method.

7. A reset signal generation circuit for resetting a system comprising:
- a phase locked loop (PLL) selector activated when an external reset signal is high, for selectively providing one of a power down control signal and an external clock signal;
- a plurality of PLLs electrically coupled to said PLL selector, for generating output frequency signals;
- a locking detector electrically coupled to said PLLs, for generating a locking signal;
- a clock selector electrically coupled to said PLLs, for receiving said external clock signal and said output frequency signals of said PLLs to generate an internal clock signal;
- a counter electrically coupled to said clock selector, for generating an overflow signal after counting a predetermined number according to said internal clock signal; and
- a reset synchronizer activated in response to said locking signal of said locking detector, for generating an internal reset signal in synchronization with said locking signal in response to said overflow signal of said counter.

8. The reset signal generation circuit according to claim 7, wherein said plurality of PLLs have different input frequency signals, and wherein said output frequency signals are different, said PLLs being activated in response to the external clock signal and inactivated in response to the power down control signal.

9. The reset signal generation circuit according to claim 7, wherein said locking detector detects locking states of said PLLs based upon the output frequency signals of said PLLs, and wherein said internal clock signal is appropriate for said system.

10. The reset signal generation circuit according to claim 7, wherein said clock selector receives the output frequency signals of said PLLs and the external clock signal and selectively provides one of the received signals.

11. The reset signal generation circuit according to claim 7, wherein said reset synchronizer operates according to an edge trigger method.

12. A reset signal generation circuit for resetting a system comprising:
- a phase locked loop (PLL) selector activated when an external reset signal is high, for selectively providing one of a power down control signal and an external clock signal;
- a plurality of PLLs of which at least one is selected in response to an output signal of said PLL selector, for generating different output frequency signals, said PLLs having different input frequency signals, said PLLs being activated in response to the external clock signal, and being inactivated in response to the power down control signal;
- a locking detector for detecting locking states of said PLLs based upon the output frequency signals of said PLLs and generating a locking signal;
- a clock selector for selecting a frequency appropriate to said system among said output frequency signals of said PLLs and said external clock signal and providing the selected frequency as an internal clock signal;
- a counter for generating an overflow signal after counting a predetermined number of internal clock signals provided by said clock selector; and
- a reset synchronizer activated in response to said locking signal of said locking detector, for generating an internal reset signal in synchronization with said locking signal in response to said overflow signal of said counter under the activated state, said reset synchronizer operating according to an edge trigger method.

13. The reset signal generation circuit according to claim 12, wherein the PLL selector selectively provides said one of the power down control signal and the external clock signal according to a target frequency.

14. The reset signal generating circuit according to claim 12, wherein the internal clock signal is based on a target frequency.

* * * * *